US010564245B2

(12) United States Patent
Takagi

(10) Patent No.: US 10,564,245 B2
(45) Date of Patent: Feb. 18, 2020

(54) RF COIL STORAGE DEVICE WITH MAGNETIC FIELD GENERATOR AND RF COIL DEVICE

(71) Applicant: TOSHIBA MEDICAL SYSTEMS CORPORATION, Otawara-Shi (JP)

(72) Inventor: Mitsuo Takagi, Otawara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 853 days.

(21) Appl. No.: 14/799,836

(22) Filed: Jul. 15, 2015

(65) Prior Publication Data
US 2016/0025798 A1    Jan. 28, 2016

(30) Foreign Application Priority Data

Jul. 28, 2014    (JP) .................................. 2014-153043

(51) Int. Cl.

| G01R 35/00 | (2006.01) |
|---|---|
| G01R 33/36 | (2006.01) |
| G01R 33/341 | (2006.01) |
| G01R 33/54 | (2006.01) |
| G01R 33/3415 | (2006.01) |

(52) U.S. Cl.
CPC .............. *G01R 35/00* (2013.01); *G01R 33/36* (2013.01); *G01R 33/3415* (2013.01); *G01R 33/3657* (2013.01); *G01R 33/3692* (2013.01); *G01R 33/546* (2013.01)

(58) Field of Classification Search
USPC ........................... 324/300–322; 600/407–435
See application file for complete search history.

(56) References Cited

U.S. PATENT DOCUMENTS

| 5,194,809 A | * | 3/1993 | Lew | ..................... G01R 33/563 |
|---|---|---|---|---|
| | | | | 324/306 |
| 6,945,935 B1 | * | 9/2005 | Sasse | ..................... G16H 40/67 |
| | | | | 600/300 |
| 2011/0169489 A1 | * | 7/2011 | Leussler | .............. G01R 33/288 |
| | | | | 324/307 |
| 2013/0271129 A1 | * | 10/2013 | Kess | ..................... G01R 33/36 |
| | | | | 324/307 |
| 2016/0025798 A1 | * | 1/2016 | Takagi | ................... G01R 35/00 |
| | | | | 324/546 |

FOREIGN PATENT DOCUMENTS

| JP | 2007-229004 A | 9/2007 |
|---|---|---|
| JP | 2007-325729 A | 12/2007 |
| JP | 2011-251118 A | 12/2011 |

* cited by examiner

*Primary Examiner* — Melissa J Koval
*Assistant Examiner* — Tiffany A Fetzner
(74) *Attorney, Agent, or Firm* — Oblon, McClelland, Maier & Neustadt, L.L.P.

(57) ABSTRACT

According to one embodiment, an RF coil storage device stores an RF coil device which receives a magnetic resonance signal from an object with a coil element in magnetic resonance imaging. This RF coil storage device includes a storage rack on which the RF coil device is placed, and processing circuitry configured to acquire an index signal which is used for determining presence/absence of a failure, from the RF coil device placed on the storage rack.

10 Claims, 10 Drawing Sheets

```
ACCORDING TO THE INSPECTION RESULT,
THE CURRENTLY STORED UPPER-BODY RF COIL DEVICE IS NORMAL.
```

240

```
ACCORDING TO THE INSPECTION RESULT OF THE CURRENTLY STORED PELVIC PART
RF COIL DEVICE, FAILURE HAS BEEN FOUND IN THE XX-TH COIL ELEMENT.
REPAIR REQUEST HAS BEEN SENT TO THE SERVICE CENTER.
PLEASE DO' NT USE IT UNTIL REPAIR IS COMPLETED.
```

240

US 10,564,245 B2

RF COIL STORAGE DEVICE WITH MAGNETIC FIELD GENERATOR AND RF COIL DEVICE

CROSS-REFERENCE TO RELATED APPLICATION

This application is based upon and claims the benefit of priority from Japanese Patent Application No. 2014-153043 filed on Jul. 28, 2014, the entire contents of which are incorporated herein by reference.

FIELD

Embodiments described herein relate generally to an RF (Radio Frequency) coil storage device and an RF coil device.

BACKGROUND

MRI is an imaging method which magnetically excites nuclear spin of an object placed in a static magnetic field with an RF pulse having the Larmor frequency and reconstructs an image based on MR signals generated due to the excitation. The above-mentioned MRI means magnetic resonance imaging, the RF pulse means a radio frequency pulse, and the MR signal means a nuclear magnetic resonance signal.

Here, an RF coil device is a device which transmits an RF pulse to nuclear spin inside an object by, for example, supplying a coil with an RF pulse electric current and receives generated MR signals.

The RF coil devices are classified into three types: a type exclusively for transmitting RF pulses, a type exclusively for receiving MR signals, and a dual-purpose type which performs both transmission of RF pulses and reception of MR signals. In addition, the RF coil devices are classified into a whole body type and a local type.

Because MR signals emitted from an object are weak and it is preferable to receive the MR signals at a position as close to the object as possible, various types of local RF coil devices in terms of shape are used in accordance with an imaging anatomical part. For example, in the case of imaging of a shoulder joint, a dedicated RF coil device for the shoulder joint is attached to the shoulder of an object.

In many cases, the whole body type RF coil device is included in a gantry of an MRI apparatus, as the dual-purpose type of performing transmission of RF pulses and reception of MR signals. Since a local RF coil device is directly attached to a patient, a local RF coil device is exposed to mechanical vibration due to attachment and detachment, vibration due to insertion and extraction of its connector into/from a connection port of an MRI apparatus, and large electric power of radio frequency inside the gantry. Because local RF coil devices are used under more severe conditions compared with each control component of an MRI apparatus as explained above, a failure of a local RF coil device may occur frequently.

Although a failure of a local RF coil device can be detected to some degree when it is connected to an MRI apparatus and used, a failure of a local RF coil device is not immediately detected in many cases. For example, a failure of a local RF coil device may occur when it is detached from an object after completion of imaging, or it may also occur while it is stored. If a local RF coil device having a failure is attached to a patient, and if the failure is detected after start of imaging, not only imaging of the object cannot be performed but also a large amount of cost and time is wasted. In order to avoid such waste of time and cost, it is desirable that failure of an RF coil device should be detected as early as possible.

DETAILED DESCRIPTION

According to one embodiment, an RF coil storage device stores an RF coil device which receives an MR signal from an object with a coil element in MRI. This RF coil storage device includes a storage rack on which the RF coil device is placed, and processing circuitry configured to acquire an index signal which is used for determining presence/absence of a failure, from the RF coil device placed on the storage rack.

According to another embodiment, an RF coil device to be stored in an RF coil storage device includes a coil element configured to receive an MR signal from an object in MRI, and this RF coil device is configured to output an index signal which is used for determining presence/absence of a failure in the RF coil device, to the RF coil storage device in response to a signal from the RF coil storage device.

Hereinafter, embodiments of the RF coil storage device and the RF coil device will be described with reference to the accompanying drawings. Note that the same reference numbers are given for identical components in each figure, and duplicate explanation is omitted.

The First Embodiment

Figure 1:
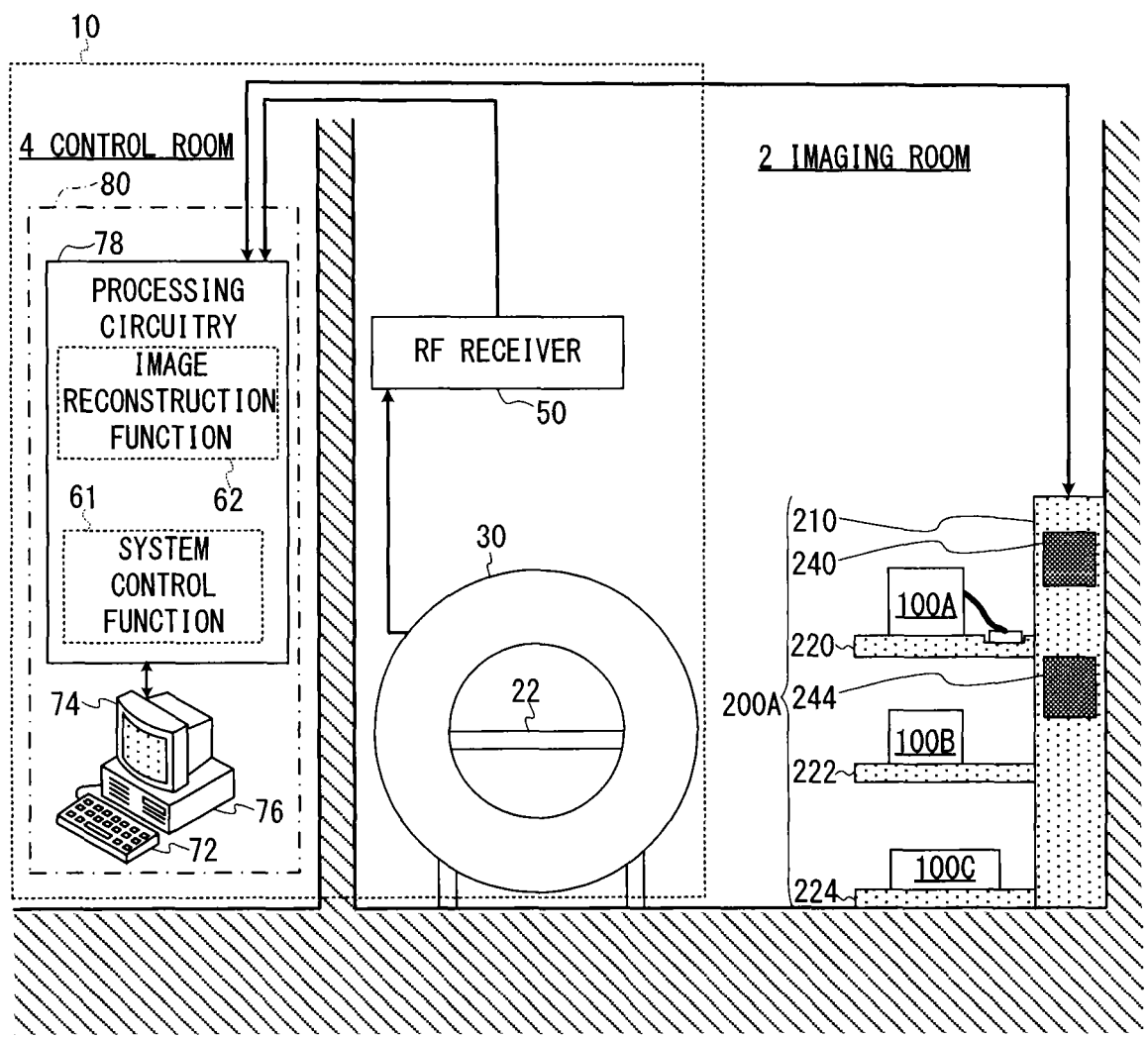
FIG. 1 is a schematic diagram showing an example of arrangement inside a control room and an imaging room where the RF coil storage device of the first embodiment and a gantry of an MRI apparatus are installed.

FIG. 1 is a schematic diagram showing an example of arrangement inside a control room 4 and an imaging room 2 where an RF coil storage device 200A of the first embodiment and a gantry 30 of an MRI apparatus 10 are installed.

As an example in the first embodiment, an RF coil storage device 200A configured as a storage shelf installed in the imaging room 2 will be explained.

As shown in FIG. 1, in the control room 4, a computer 80 of the MRI apparatus 10 including an input device 72, a display 74, a memory circuit 76, processing circuitry 78, etc. is disposed. The processing circuitry 78 includes one or more processors and the processors achieve a system control function 61 or an image reconstruction function 62 as mentioned below.

In the imaging room 2, the gantry 30, an RF receiver 50, etc. of the MRI apparatus 10 are disposed. In addition, a non-illustrated bed device of the MRI apparatus 10 is disposed in the imaging room 2. When imaging is performed, an object is loaded on the table 22 of the bed device and the table 22 is moved into inside of the gantry 30.

In the gantry 30, non-illustrated components such as a static magnetic field magnet configured to form a static magnetic field, a gradient coil, a whole body coil, etc. are included. The gradient coil generates the respective gradient magnetic fields in the slice selection direction, the phase encode direction, and the readout direction by consuming electric power supplied from a non-illustrated gradient magnetic field power source. The whole body coil has both functions of receiving MR signals and transmitting RF pulses to an imaging region based on RF pulse electric currents inputted from a non-illustrated RF transmitter.

The RF coil devices (100A, 100B, and 100C) to be attached to an object respectively receive MR signals from the object, and the received MR signals are inputted to the RF receiver 50.

The RF receiver 50 generates raw data as complex number data of digitized MR signals obtained by performing predetermined signal processings on the MR signals, and inputs the generated raw data to the processing circuitry 78.

The processing circuitry 78 achieves image reconstruction function 62. Specifically, the processing circuitry 78 stores the raw data of MR signals as k-space data (spatial frequency data), and then generates image data of an object by performing an image reconstruction processing on the k-space data.

In addition, the processing circuitry 78 achieves a system control function 61. Specifically, the processing circuitry 78 performs system control of the entirety of the MRI apparatus 10 in setting of imaging conditions, imaging operation, and image display.

The input device 72 provides a user with a function to set the imaging conditions and image processing conditions.

The memory circuit 76 stores the image data generated by the image reconstruction function 62.

The display 74 displays the above image data of the object as an image.

The RF coil storage device 200A stores wearable type RF coil devices and determines presence/absence of a failure for each of these wearable type RF coil devices. The RF coil storage device 200A corresponds to the area filled with multiple dots in the lower right side of FIG. 1. As an example here, the RF coil storage device 200A is fixed to the wall of the imaging room 2 indicated with the diagonally right down shadow area.

The RF coil storage device 200A has a structure in which the shelves 220, 222, and 224 are horizontally fixed (joined) to a supporting board 210 arranged in parallel with the vertical direction. In the example of FIG. 1, an upper-body RF coil device 100A, a head part RF coil device 100B, a pelvic part RF coil device 100C, etc. are placed on the respective shelves 220, 222, and 224 of the RF coil storage device 200A.

In other words, at least each of the shelves 220, 222, and 224 configures a storage rack for storing RF coil devices. Although an example in which RF coil devices are simply placed on the shelves 220, 222, and 224 is shown in FIG. 1, this is only an example of storage methods. For example, a structure of holding an RF coil device from both sides for fixing it may be disposed to each shelf.

As an example here, a monitor 240 configured to display determination results as to the presence/absence of a failure and an operation device 244 are disposed on the supporting board 210 of the RF coil storage device 200A.

Figure 2:
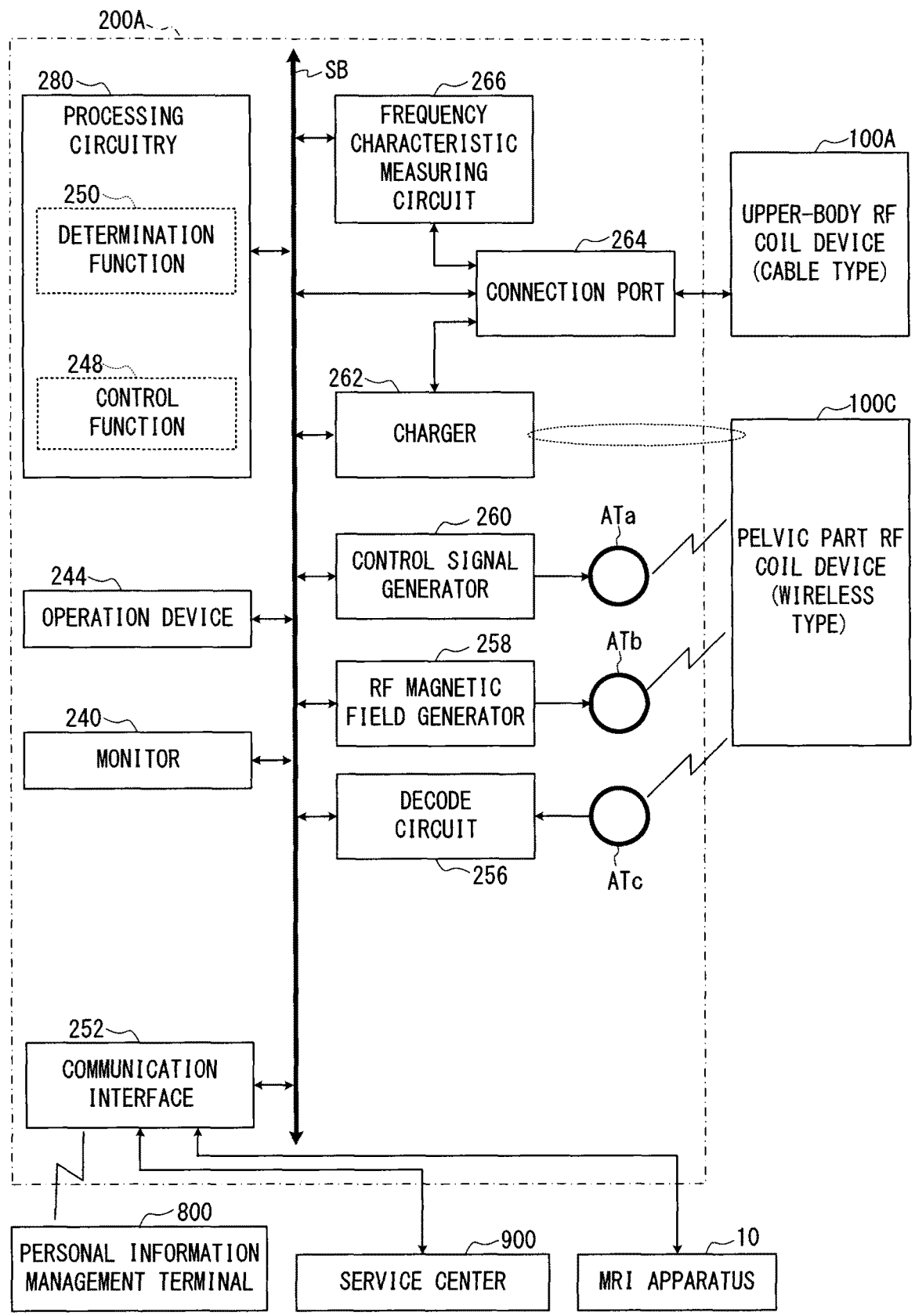
FIG. 2 is a functional block diagram showing an example of overall configuration of the RF coil storage device of the first embodiment.

FIG. 2 is a functional block diagram showing an example of overall configuration of the RF coil storage device 200A of the first embodiment. As shown in FIG. 2, the RF coil storage device 200A includes the monitor 240, the operation device 244, processing circuitry 280, a communication interface 252, a decode circuit 256, an RF magnetic field generator 258, a control signal generator 260, a charger 262, connection ports 264, a frequency characteristic measuring circuit 266, a system bus SB, and search coils ATa, ATb, and ATc. The processing circuitry 280 includes a processor as an example, and achieves various functions such as a control function 248, a determination function 250, etc. by this processor.

The system bus SB is communication wiring which mutually connects the respective components of the RF coil storage device 200A.

The operation device 244 includes switches, a touch panel, etc., and provides a user with a function of inputting various conditions and commands. The above conditions and commands means, for example, conditions of determination operation as to the presence/absence of a failure of an RF coil device, a start command of the determination operation, display of the determination result, a command to start charging, a command to stop charging, etc.

The monitor 240 displays data used for determining the presence/absence of a failure of an RF coil device, the determination result, etc. As to methods of notifying the determination result as to presence/absence of a failure of an RF coil device, simpler structure configured to light a lamp only in the case of having detected a failure may be disposed instead of the monitor 240. Alternatively or additionally, a notification unit configured to sound an alarm only in the case of having detected a failure of an RF coil device may be disposed instead of the monitor 240.

The communication interface 252 is communication wiring which connects the RF coil storage device 200A with the MRI apparatus 10 by wire. In addition, the communication interface 252 is also connected to a service center 900 where checkup and repair of the MRI apparatus 10 are performed. Moreover, the communication interface 252 wirelessly transmits data used for determining the presence/absence of a failure of an RF coil device to a personal information management terminal 800 owned by a staff member who performs checkup and repair of the MRI apparatus 10, for example.

The communication interface 252 downloads the latest version of each control program of each RF coil device stored in the RF coil storage device 200A by periodically communicating with the service center 900. The communication interface 252 installs the downloaded programs to the control circuit of each RF coil device (for instance, the selection control circuit 108 in the example of FIG. 4 described below).

In the case of a cable type RF coil device, install of the control programs can be done via one of the connection ports 264. On the other hand, in the case of a wireless type RF coil device, install of the control programs can be done by wirelessly transmitting data of the latest version of each control program from the control signal generator 260 via the search coil ATa as an antenna.

In the above control programs, the programs which respectively perform various determination processings as to the presence/absence of a failure of an RF coil device described below are included. A concrete example for the above determination processings is a processing of testing forward characteristics and reverse characteristics of a diode of a trap circuit provided for each coil element in an RF coil device, etc.

The control function 248 of the processing circuitry 280 controls the entire operation of the RF coil storage device 200A via the system bus SB.

The control signal generator 260 wirelessly transmits a control signal to a wireless type RF coil device via the search coil ATa. The above control signal means, for example, a control signal which selects a coil element as an inspection target.

The RF magnetic field generator 258 radiates an RF (Radio Frequency) magnetic field for inspecting frequency characteristics of each coil element of an RF coil device to a space from the search coil ATb.

The decode circuit 256 receives a transmitted wave transmitted from a coil element of a wireless type RF coil device via the search coil ATc, after radiation of the above RF magnetic field. The decode circuit 256 decodes the received transmitted wave, and then inputs the decoded data of the transmitted wave to the processing circuitry 280.

The charger 262 charges a rechargeable battery BA of a wireless type RF coil device (FIG. 7 described below), via an induced magnetic field.

Although only one of connection ports 264 is shown in FIG. 2, the actual number of the connection ports 264 disposed to the shelves 220, 222, and 224 in FIG. 1 is equal to or larger than the maximum number of cable type RF coil devices to be stored in the RF coil storage device 200A. A connector (such as a connector 114 in FIG. 3 described below) of a cable type RF coil device is connected to one of the connection ports 264.

The frequency characteristic measuring circuit 266 generates an RF electric current for determining whether the function of each coil element of a cable type RF coil device is normal or not. The frequency characteristic measuring circuit 266 includes a directional coupler in its inside, and transmits the above RF electric current to a coil element of a cable type RF coil device via the directional coupler and one of the connection ports 264. The frequency characteristic measuring circuit 266 receives a reflected signal (current) from the coil element via the directional coupler and the one of the connection ports 264, and inputs the data of the received reflected signal to the processing circuitry 280.

The processing circuitry 280 stores data used for determining whether a failure exists or not, for each RF coil device.

The above data means data used for determining the presence/absence of a failure such as (a) the identification information of each RF coil device, (b) data of normal frequency characteristics of a reflected signal, (c) normal time variation of a primary current at the time of charging, (d) normal time variation of a charging voltage of a rechargeable battery at the time of charging, (e) current-voltage characteristics of a diode of a trap circuit, for example.

The determination function 250 of the processing circuitry 280 determines whether a failure exists in an RF coil device or not, based on an index signal such as the data of the transmitted wave inputted from the decode circuit 256, or the data of the transmitted signal inputted from the frequency characteristic measuring circuit 266, etc. As to methods of determining whether a failure exist or not will be explained in detail from FIG. 5.

Out of the components of the RF coil storage device 200A, the charger 262, the connection ports 264, and the search coils ATa, ATb, and ATc are preferably disposed close to an RF coil device to be stored and are disposed on each shelves 220, 222, and 224, for example. The other components of the RF coil storage device 200A are, for example, disposed inside the supporting board 210.

Figure 3:
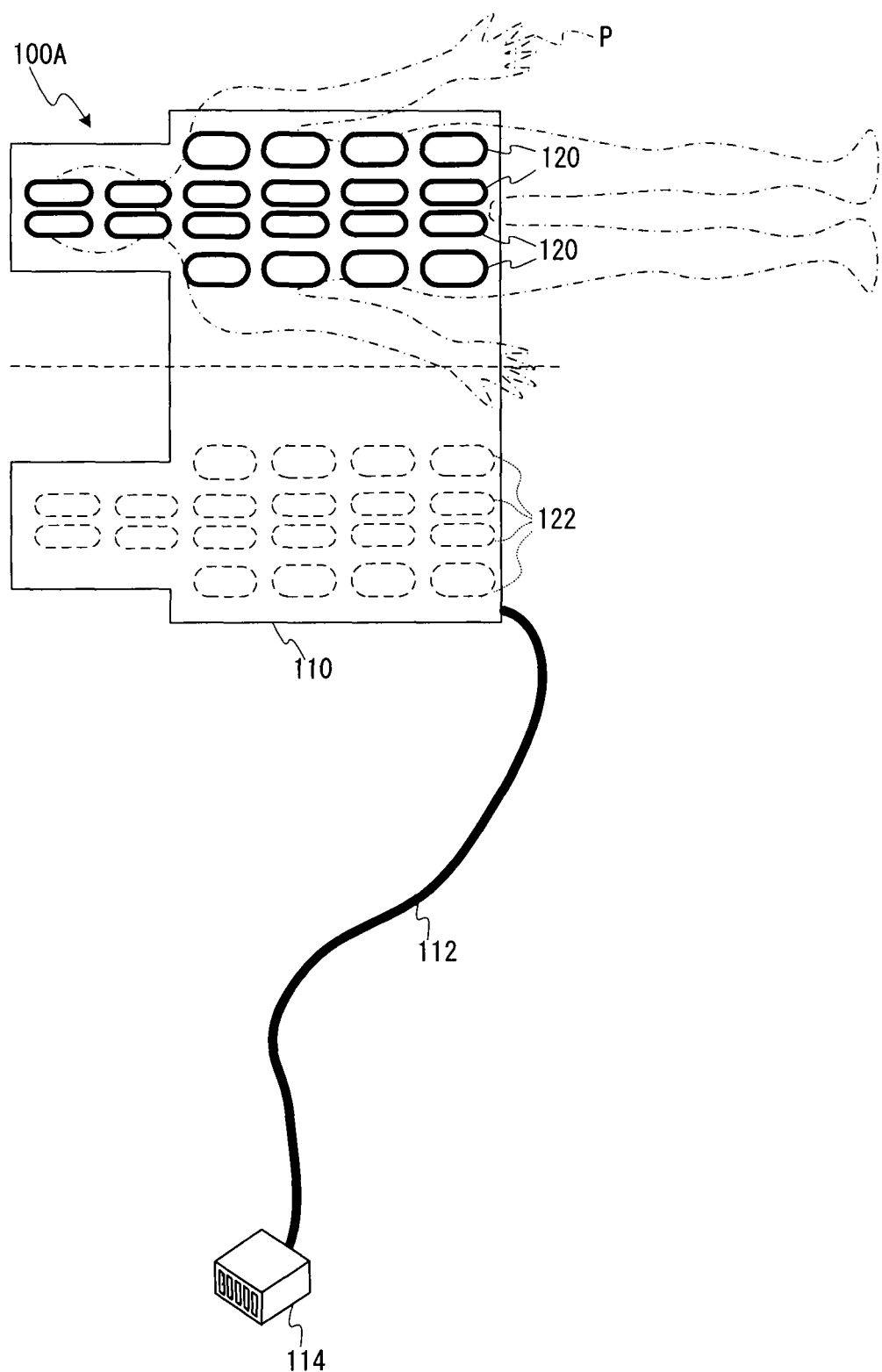
FIG. 3 is a schematic planimetric diagram showing an example of configuration of an upper-body RF coil device as an example of wearable type RF coil devices configured to receive MR signals.

FIG. 3 is a schematic planimetric diagram showing an example of configuration of an upper-body RF coil device 100A as an example of wearable type RF coil devices configured to receive MR signals. As an example here, the upper-body RF coil device 100A is assumed to be connected to the MRI apparatus 10 by wire. As shown in FIG. 3, the upper-body RF coil device 100A includes a cover member 110, a cable 112, and a connector 114.

The cover member 110 is made of deformable material so as to be deformable such as folding etc. As such deformable material, for example, a flexible circuit board (Flexible Printed Circuit: FPC) described in Japanese Patent Application Laid-open (KOKAI) Publication No. 2007-229004 can be used.

For example, twenty of coil elements 120 corresponding to the back side of the object are arranged inside the upper half of the cover member 110 bisected by the horizontal broken line in FIG. 3. The bisected lower half of the cover member 110 is configured to overlay the head part, the chest part, and the abdominal part of the object P. For example, twenty of coil elements 122 corresponding to the anterior side of the object are arranged inside the lower half of the cover member 110. Incidentally, the coil elements 120 are shown by bold lines and the coil elements 122 are shown by broken lines in FIG. 3.

In addition, the upper-body RF coil device 100A includes a selection control circuit 108 (FIG. 4) and a non-illustrated memory element storing the identification information of the upper-body RF coil device 100A in the cover member 110. When the connector 114 is connected to the connection port 264 of the RF coil storage device 200A, the identification information of the upper-body RF coil device 100A is inputted to the RF coil storage device 200A via the connector 114 and the connection port 264.

Figure 4:
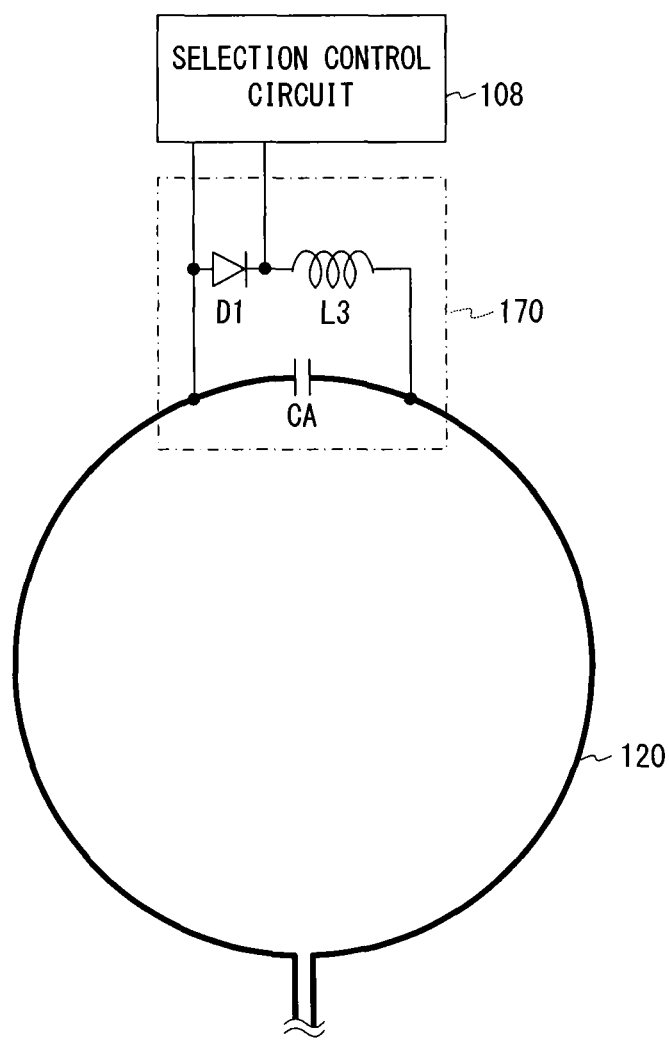
FIG. 4 is a schematic circuit diagram showing an example of a trap circuit provided for each coil element of an RF coil device.

FIG. 4 is a schematic circuit diagram showing an example of a trap circuit provided for each of the coil elements 120 and 122 of the upper-body RF coil device 100A.

A trap circuit is, for example, a circuit which switches on/off of a function of receiving MR signals of each coil element 120/122, by switching between an operating state (on-state) and a non-operating state (off-state).

In FIG. 4, an active trap circuit 170 is shown as an example of a trap circuit.

The active trap circuit 170 includes a capacitor CA, a PIN (p-intrinsic-n) diode D1, and a coil L3, and these components are wired with respect to each coil element 120/122 as shown in FIG. 4. The circuit constants such as the inductance value of the coil L3, the capacitance value of the capacitor CA, the forward resistance value of the PIN diode D1, etc. are selected so that the resonance frequency of the loop circuit consisting of the capacitor CA, the PIN diode D1, and the coil L3 becomes the Larmor frequency.

When at least one coil element 120 is selected for receiving MR signals by the MRI apparatus 10, the selection control circuit 108 brings the PIN diode D1 into a conductive state by applying the turn-on voltage in the forward direction to the PIN diode D1 in a period during which a gate signal inputted from the MRI apparatus 10 is on-level.

During the on-level period of the gate signal, the circuit wiring the capacitor CA, the PIN diode D1, and the coil L3 in a loop resonates and is in a high impedance state because an excitation RF pulse of the Larmor frequency is transmitted. Thereby, the coil element 120 becomes a state where its loop is disconnected at the part of the capacitor CA, and cannot receive MR signals during the on-level period of the gate signal.

When the coil element 120 is not selected for receiving MR signals, the selection control circuit 108 continues to apply the turn-on voltage in the forward direction to the PIN diode D1. Thereby, the coil element 120 cannot receive MR signals continuously and the coupling effect with another coil element selected for receiving MR signals is prevented.

Next, four examples of the processings of inspecting presence/absence of a failure of an RF coil device by the RF coil storage device 200A will be explained in order. The determination function 250 determines that the RF coil device as the inspection target is normal, only in the case where abnormality has not been found in any of the following first to fourth inspection processings. Otherwise, the RF coil device is determined to be defective and only the abnormal part in the inspection result is displayed on the monitor 240.

As the first inspection processing, the RF coil storage device 200A inspects presence/absence of a failure, based on whether or not the RF coil storage device 200A can normally acquire identification information of the RF coil device from this RF coil device. The above identification information means all the information that identifies this RF coil device such as the attaching position on an object, its transmission type of wireless type or cable type, its manufacturing number, etc.

In addition, if another inspection processing is performed before acquisition of the identification information, it is difficult to determine what kind of inspection result corresponds to normality. Thus, as the inspection processing to be performed first, it is preferable to acquire the identification information.

In the case of a cable type RF coil device, the control signal generator 260 (FIG. 2) inputs a command signal to transmit the identification information to this target RF coil device via the connection port 264. Afterward, the identification information transmitted from this RF coil device is transmitted by wire to the control signal generator 260 via the connection port 264. The control signal generator 260 inputs the acquired identification information to the determination function 250 of the processing circuitry 280.

If the identification information has been normally acquired, the determination function 250 determines that this RF coil device does not have a failure as to the identification information and inputs the identification information to the control function 248 of the processing circuitry 280. If the identification information has not been normally acquired, the determination function 250 determines that this RF coil device has a failure as to the identification information.

In the case of a wireless type RF coil device, the control signal generator 260 makes the search coil Ata wirelessly transmit a command signal to transmit the identification information. In this case, the wireless type RF coil device as the inspection target wirelessly transmits its identification information under the control of its control circuit, and the search coil ATc detects an electromagnetic wave of this identification information. Afterward, the decode circuit 256 decodes the original identification information from the electromagnetic wave of the identification information detected by the search coil ATc, and inputs the detected identification information to the determination function 250.

Thereby, if the determination function 250 has normally acquired the identification information, the determination function 250 determines that this RF coil device does not have a failure as to the identification information and inputs the acquired identification information to the control function 248. On the other hand, if the identification information has not been normally acquired, the determination function 250 determines that this RF coil device has a failure as to the identification information.

As the second inspection processing, the RF coil storage device 200A inspects operational normality of the PIN diode D1 of the active trap circuit 170. The second inspection processing is practicable in the case of a cable type RF coil device like the upper-body RF coil device 100A as an example. The second inspection processing is not performed in the case of a wireless type RF coil device which does not include a wired transmission/reception system of signals.

Specifically, the control signal generator 260 inputs an inspection command of the active trap circuit 170 to the selection control circuit 108 (FIG. 4) of the upper-body RF coil device 100A, via the system bus SB and one of the connection ports 264.

When this inspection command is inputted, the selection control circuit 108 measures forward current-voltage characteristics of the PIN diode D1 for each of the coil elements 120 and 122, and outputs the measurement results to the determination function 250 of the processing circuitry 280 via one of the connection ports 264. The determination function 250 determines the presence/absence of a failure in the PIN diode D1 for each of the coil elements 120 and 122. Specifically, in the case where a large amount of a forward current flows and a reverse current hardly flows, it is determined to be normal. Otherwise, it is determined to have a failure.

As the third inspection processing, the RF coil storage device 200A inspects normality of each coil element, based on transmission characteristics with respect to an RF magnetic field of each coil element.

Figure 5:
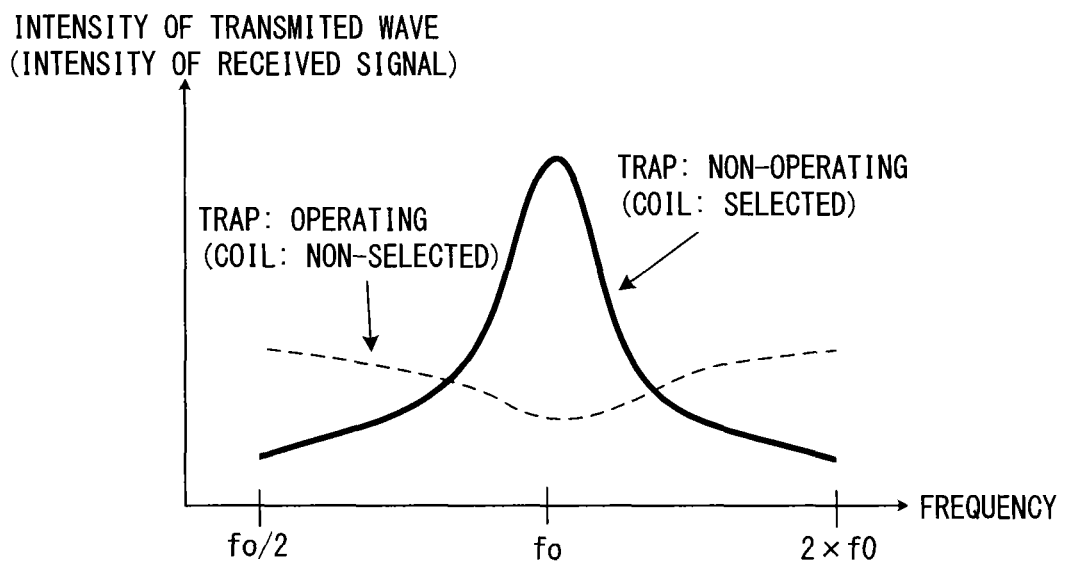
FIG. 5 is a schematic diagram showing an example of frequency characteristics of voltage of a transmitted signal or intensity of an electromagnetic wave transmitted from an coil element, after an RF magnetic field is emitted from a search coil to a space.

FIG. 5 is a schematic diagram showing an example of frequency characteristics of voltage of signal transmitted via an coil element, after an RF magnetic field is emitted from the search coil ATb to a space. In FIG. 5, the horizontal axis indicates frequency.

In the case of a wireless type RF coil device, the vertical axis indicates intensity of a transmitted electromagnetic wave, which is detected by the search coil ATc via the coil element and then measured by the decode circuit 256 after radiation of an RF magnetic field from the search coil ATb.

In the case of a cable type RF coil device, the vertical axis indicates voltage level of a transmitted signal, which is inputted to the frequency characteristic measuring circuit 266 by way of the connection port 264 via the coil element after radiation of an RF magnetic field from the search coil ATb.

Here, the control signal generator 260 makes the search coil Ata radiate an RF magnetic field plural times while changing the frequency of the RF magnetic field around the Larmor frequency for each radiation, so as to obtain frequency characteristics of the transmitted signal from the coil element. The frequency range is a frequency band including the Larmor frequency. Thus, the frequency range is, for example, from a half of the Larmor frequency to double of the Larmor frequency. However, this is only an example.

When the trap circuit is in a non-operating state, the frequency characteristics of intensity of the transmitted wave (reception signal) from each coil element have a steep peak at the Larmor frequency like the bold line in FIG. 5. This is because the function of receiving MR signals of each coil element is not turned off, when the trap circuit is in a non-operating state.

When the trap circuit of each coil element is normal and the trap circuit is in an operating state, the frequency characteristics of intensity of the transmitted wave (reception signal) drastically decrease around the Larmor frequency like the broken line in FIG. 5. This is because the function of receiving MR signals of each coil element is turned off by the trap circuit in the operating state.

However, when the trap circuit of each coil element is deteriorated or has a failure and the trap circuit is in the operating state, the frequency characteristics of intensity of the transmitted wave (reception signal) do not change from the bold line to the broken line in FIG. 5.

The above inspection of frequency characteristics is performed for each coil element of an RF coil device in order. If at least one coil element is not normal according to the above inspection results, the determination function 250 of the processing circuitry 280 determines that the RF coil device has a failure.

Because plural coil elements are included in an RF coil device in general, it is preferable to enable to specify which coil element is currently radiating the transmitted wave. For this reason, in the case of a wireless type RF coil device, the control signal generator 260 turns off all the coil elements other than one coil element as the inspection target. In this case, the control signal generator 260 makes the search coil ATa wirelessly transmit a control signal for turning off specified coil elements to the wireless type RF coil device.

The above control signal is, for example, a command to turn off the function of receiving RF magnetic fields by applying the turn-on voltage to the PIN diode D1 of the active trap circuit 170 in FIG. 4 so as to disconnect the loop at the capacitor CA in the Larmor frequency.

When the signal lines to be inputted to the connection ports 264 are divided for each coil element in the case of a cable type RF coil device, the control signal for selecting a coil element is unnecessary.

In addition, in the case of a cable type RF coil device, an input wave may be transmitted by wire as follows instead of wirelessly transmitting an RF magnetic field as the input wave in the above manner.

Figure 6:
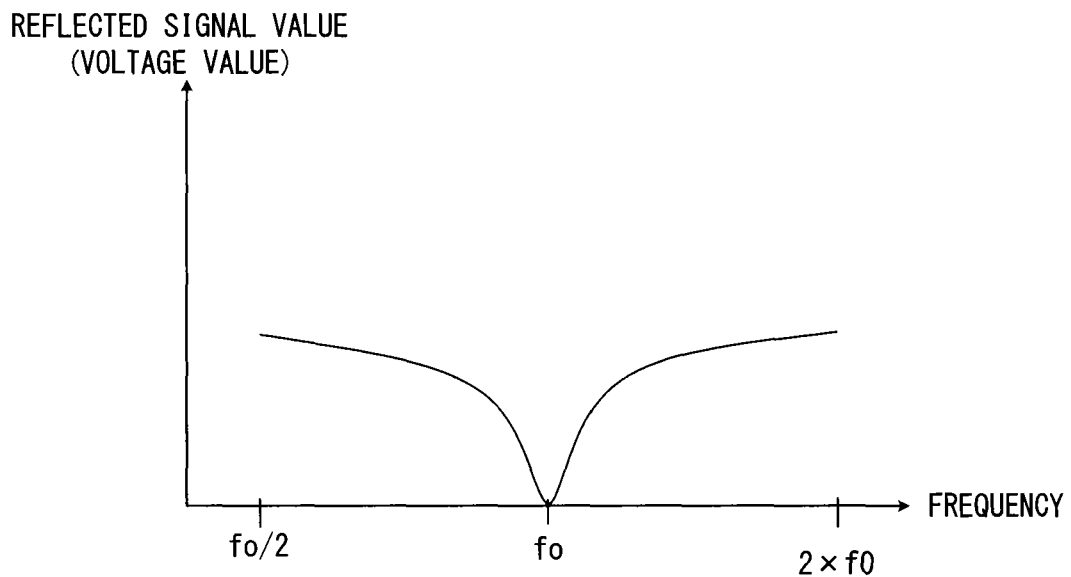
FIG. 6 is a schematic diagram showing an example of frequency characteristics of voltage of a reflected signal reflected from an coil element after inputting an RF pulse electric current, in the case of a cable type RF coil device.

FIG. 6 is a schematic diagram showing an example of frequency characteristics of voltage of a reflected signal reflected from a coil element after inputting an RF electric current, in the case of a cable type RF coil device. In FIG. 6, the horizontal axis indicates frequency and the vertical axis indicates voltage level of a reflected signal inputted to the frequency characteristic measuring circuit 266 via the connection port 264.

More concretely, physical property values of each coil element of an RF coil device such as an ohmic value of each circuit element etc. are selected so that the impedance of the entire coil element becomes a predetermined value such as 50Ω etc. at the Larmor frequency. This predetermined value is a value selected so that voltage level of the reflected wave outputted by wire becomes a local minimum level at the Larmor frequency.

The frequency characteristic measuring circuit 266 transmits an RF pulse electric current to each coil element by wire via a non-illustrated internal directional coupler, while changing its frequency from a half of the Larmor frequency to double of the Larmor frequency as an example.

If the RF coil device is normal, the frequency characteristics of the voltage level of the reflected signal inputted to the frequency characteristic measuring circuit 266 by wire via the directional coupler indicate a local minimum value (zero) at the Larmor frequency as shown in FIG. 6.

If the frequency characteristics as shown in FIG. 6 are not obtained, there is a high possibility that the coil element as the inspection target has an abnormality, and thus the determination function 250 of the processing circuitry determines that this RF coil device has a failure.

As the fourth inspection processing, the RF coil storage device 200A inspects whether a rechargeable battery is normal or not, as to each wireless type RF coil device in which a rechargeable battery is included.

Figure 7:
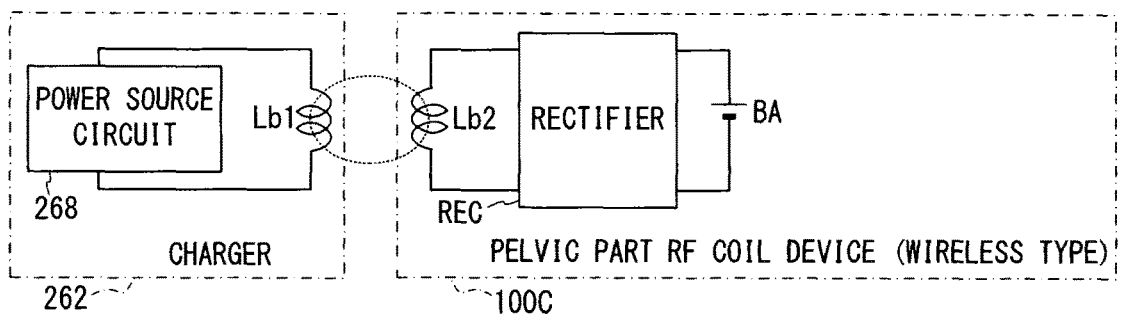
FIG. 7 is a schematic circuit diagram showing a charger of the RF coil storage device and a rechargeable battery of a wireless type pelvic part RF coil device.

FIG. 7 is a schematic circuit diagram showing the charger 262 of the RF coil storage device 200A and the rechargeable battery BA of the wireless type pelvic part RF coil device 100C. As shown in FIG. 7, the charger 262 includes a power source circuit 268 and a primary coil Lb1. The pelvic part RF coil device 100C includes a secondary coil Lb2, a rectifier REC, and the rechargeable battery BA.

When the pelvic part RF coil device 100C is placed at a predetermined position of the RF coil storage device 200A, the primary coil Lb1 and the secondary coil Lb2 are within close distance to be mutually electromagnetically coupled. In this case, an alternating excitation current (as the primary current) from the power source circuit 268 is supplied to the primary coil Lb1 and an alternating induced current (i.e. the secondary current) is generated in the secondary coil Lb2 via an induced magnetic field. Thereby, the rectifier REC rectifies the alternating induced current into a direct current and charges the rechargeable battery BA.

Figure 8:
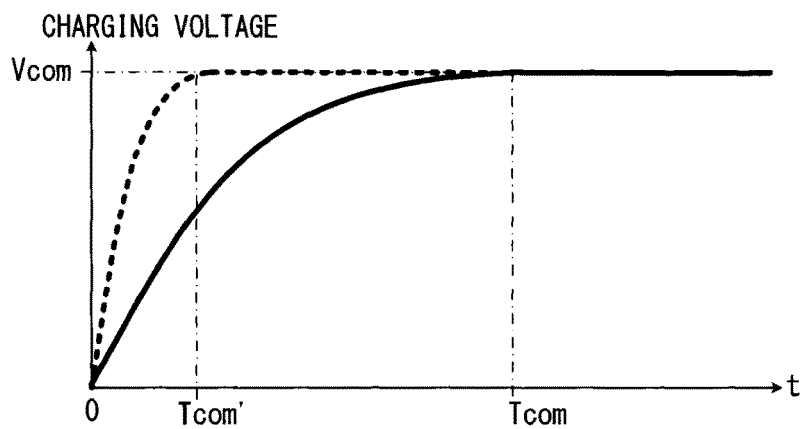
FIG. 8 is a schematic diagram showing an example of time variation of a charging voltage of the rechargeable battery.

FIG. 8 is a schematic diagram showing an example of time variation of the charging voltage of the rechargeable battery BA. In FIG. 8, the horizontal axis indicates elapsed time t from start of charging and the vertical axis indicates the charging voltage (volt) of the rechargeable battery BA. As an example here, a case where the charging voltage of the rechargeable battery BA at time t=0 is zero is shown.

When the rechargeable battery BA is normal, a long charging time Tcom is needed until reaching the charging completion voltage Vcom and the time variation of the charging voltage becomes like the one shown with the bold line in FIG. 8. This is because a large amount of electric charge can be accumulated inside in the case of a normal rechargeable battery. On the other hand, when the rechargeable battery BA is deteriorated, the time variation of the charging voltage becomes like the one shown with the broken line in FIG. 8 and the charging voltage reaches the charging completion voltage Vcom in a short time. This is because only a little amount of electric charge can be accumulated compared with a new unused battery if the rechargeable battery BA is deteriorated.

Figure 9:
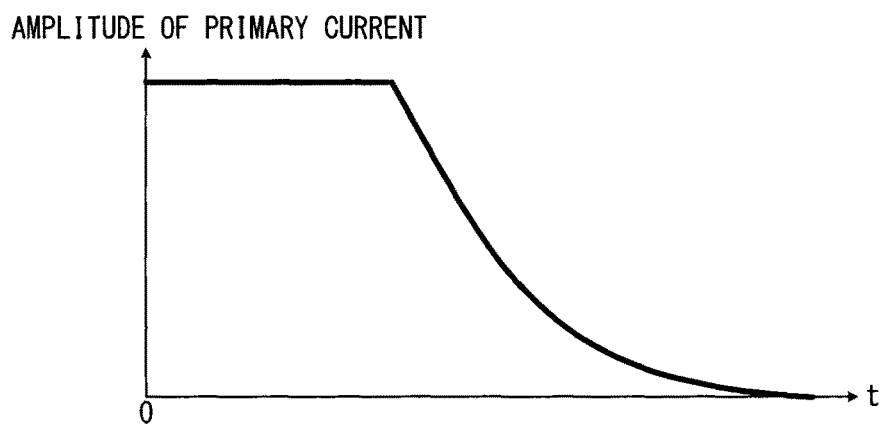
FIG. 9 is schematic diagram showing an example of time variation of the primary current, in the case of charging a normal rechargeable battery from the state where its charging voltage is zero to the state where it is fully charged like the bold line in FIG. 8.

FIG. 9 is schematic diagram showing an example of time variation of the primary current, in the case of charging the normal rechargeable battery BA from the state where its charging voltage is zero to the state where its charging voltage reaches the charging completion voltage Vcom like the bold line in FIG. 8. In FIG. 9, the horizontal axis indicates elapsed time t from start of charging and the vertical axis indicates amplitude of the primary current.

The higher the charging voltage of the rechargeable battery BA of the secondary side becomes, the higher the impedance of the secondary side viewed from the primary side (the power source circuit 268 side) becomes. Thus, when the rechargeable battery BA reaches the charging completion voltage Vcom, the impedance becomes high such that it is unable to generate the induced current (secondary current) in the secondary side.

In other words, in the beginning period during which the charging voltage of the rechargeable battery BA is small, the primary current is constant at the maximum value and the rechargeable battery BA is charged by a constant current. As the charging voltage of the rechargeable battery BA becomes higher, the primary current becomes smaller and the induced current becomes approximately zero when the rechargeable battery BA reaches the charging completion voltage Vcom.

Thus, when the rechargeable battery BA is charged, the charger 262 measures the time variation of amplitude of the primary current and inputs the data of the measured time variation to the determination function 250 of the processing circuitry 280. The determination function 250 determines the degree of deterioration of the rechargeable battery BA, based on (a) the type and normal electric characteristics of the rechargeable battery BA determined by the identification information of the RF coil device and (b) the data of time variation of amplitude of the primary current.

For example, if the length of the charging time from the time when the primary current is the maximum to the time when the primary current becomes zero is long enough compared with normal characteristics of the rechargeable battery BA, the determination function 250 determines that the rechargeable battery BA is normal. Otherwise, the determination function 250 determines that the rechargeable battery BA is deteriorated.

In relation to charging, an RF coil device, which wirelessly receives control signals of the MRI apparatus 10 and wirelessly transmits the received MR signals to the MRI apparatus 10 but includes the rechargeable battery BA as its only wired-type component, is charged in the following manner. That is, a non-illustrated charging connector of such an RF coil device is connected to the connection port of the RF coil storage device 200A and the rechargeable battery BA is charged by wire by the RF coil storage device 200A.

In this case, instead of the above-mentioned determination method, the degree of deterioration of the rechargeable battery BA may be determined in the following process. First, the charger 262 acquires time variation of the charging voltage of the rechargeable battery BA from the RF coil device side by wire. Next, the determination function 250 determines the degree of deterioration of the rechargeable battery BA based on (a) the time variation of the charging voltage acquired from the charger 262 and (b) normal characteristics of the rechargeable battery BA determined by the identification information of the RF coil device. When the charging time until reaching the charging completion voltage Vcom is long enough, it is determined to be normal. Otherwise, it is determined to be deteriorated.

If an RF coil device is determined to have a failure by the determination function 250 of the processing circuitry 280 in at least one of all the above-mentioned inspection processings, the determination function 250 makes the monitor 240 display the presence of a failure in this RF coil device.

At the same time, the determination function 250 controls the communication interface 252 so as to transmit (a) the identification information of the defective RF coil device, (b) the failure spot, and (c) the data used for determining presence/absence of a failure (like the frequency characteristics in FIG. 5), to the service center 900 and the MRI apparatus 10.

Moreover, the determination function 250 makes the communication interface 252 wirelessly transmit the data used for determining presence/absence of a failure to the personal information management terminal 800 carried by a service staff member of a manufacturer of the MRI apparatus 10. Thereby, the service staff member can take a proper action such as replacing the deteriorated rechargeable battery BA before a failure occurs.

Next, execution timing of the above processings of determining whether a failure exists in an RF coil device or not will be explained.

As the first example, the control function 248 of the processing circuitry 280 may control each component of the RF coil storage device 200A, so that the inspection processings of determining presence/absence of a failure of an RF coil device are performed in the night time during which the power of the MRI apparatus 10 is usually turned off. Note that the charging processing is included in the inspection processings in the case of a charge-type RF coil device.

As the second example, in the case of a cable type RF coil device, the control function 248 may control each component of the RF coil storage device 200A so that the inspection processings as to presence/absence of a failure is performed immediately after the cable type RF coil device is connected to the connection port 264.

In the case of a wireless type RF coil device, the control function 248 may control each component of the RF coil storage device 200A so that the above charging processing and the inspection processings as to presence/absence of a failure are performed immediately after a wireless type RF coil device is placed on the RF coil storage device 200A and located within a changeable range by the charger 262.

Note that the control function 248 stops operation of each component of the RF coil storage device 200A in order to suppress noise in each period during which the MRI apparatus 10 performs a pulse sequence. The above operation includes the inspection processings as to presence/absence of a failure of an RF coil device, the charging processing, wireless transmission of data to the personal information management terminal 800, etc.

As to whether the MRI apparatus 10 is in an operating state or not, the control function 248 can recognize it by receiving such data that indicates a pulse sequence is currently in progress, from the MRI apparatus 10 via the communication interface 252. Alternatively or additionally, the control function 248 may detect an RF pulse outputted from the MRI apparatus 10 by using the antenna Atc and the decode circuit 256 and stop the operation of each component of the RF coil storage device 200A for a predetermined period after detecting the RF pulse.

As the third example, the RF coil storage device 200A may be configured to start the inspection processings (and the charging processing) in synchronization with the timing when a non-illustrated inspection start button of the operation device 244 is pushed by a user.

Figures 10, 11:
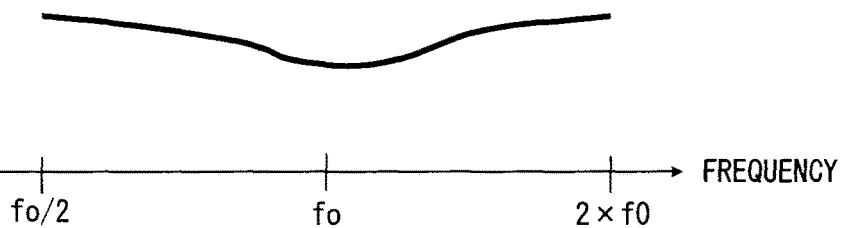
FIG. 10 is a schematic diagram showing an example of display of inspection results as to the presence/absence of a failure of an RF coil device.
FIG. 11 is a schematic diagram showing another example of display of inspection results as to the presence/absence of a failure of an RF coil device.

FIG. 10 is a schematic diagram showing an example of display of inspection results as to presence/absence of failure of RF coil devices.

If any abnormality has not been found in all of the executed inspection processings, the determination function 250 of the processing circuitry 280 controls the monitor 240 so as to display information that the inspection result of the RF coil device is normal, with text information as an example. As an example here, the fourth inspection processing is not preformed if a rechargeable battery is not included in an RF coil device, and the second inspection processing is not performed in the case of a wireless type RF coil device.

FIG. 11 is a schematic diagram showing another example of display of inspection results as to presence/absence of failure of RF coil devices. In this example, because abnormality of frequency characteristics of a reflected wave from the XX-numbered coil element is detected only in the third inspection processing for the pelvic part RF coil device 100C, the data of the frequency characteristics are displayed. At the same time, (a) information that this RF coil device has a failure, (b) information that repair request of this RF coil device has been sent to the service center, and (c) this RF coil device cannot be used until repair completion, are displayed on the monitor 240 with textual information.

Figure 12:
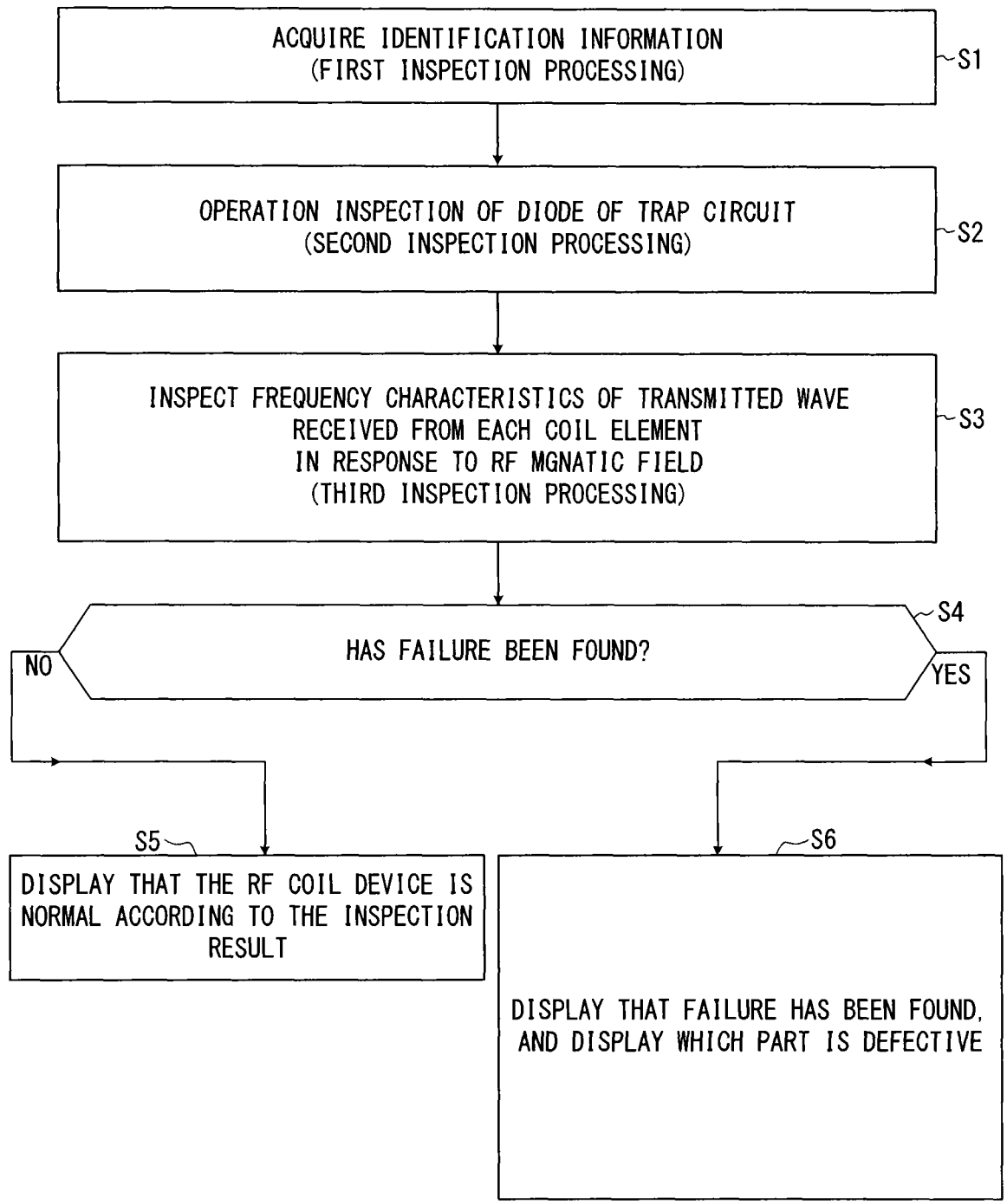
FIG. 12 is a flowchart showing an example of operation of the RF coil storage device, while storing an RF coil device configured to be connected to a connection port and be supplied with electric power by wire from an MRI apparatus at the time of performing MRI.

FIG. 12 is a flowchart showing an example of operation of the RF coil storage device 200A, while storing an RF coil device configured to be connected to the connection port 264 and be supplied with electric power by wire from the MRI apparatus 10 at the time of performing MRI. In the following, according to the step numbers in the flowchart shown in FIG. 12, operation of the RF coil storage device 200A will be described by referring to the above-mentioned FIG. 1 to FIG. 11 as required.

[Step S1] As the above-mentioned first inspection processing, the control signal generator 260 (FIG. 2) inputs a command signal to transmit the identification information to the RF coil device as the inspection target. Afterward, the control signal generator 260 acquires the identification information from this RF coil device, and inputs the acquired identification information, as an index signal, to the determination function 250 of the processing circuitry 280.

If the determination function 250 has normally acquired the identification information, the determination function 250 determines that this RF coil device is normal as to the identification information and inputs the acquired identification information to the control function 248 of the processing circuitry 280. If the identification information has not been normally acquired, the determination function 250 determines that this RF coil device has a failure as to the identification information.

After this, the processing proceeds to the Step S2.

[Step S2] As the above-mentioned second inspection processing, the control signal generator 260 inputs a command to inspect the active trap circuit 170 (FIG. 4) to the selection control circuit of the RF coil device.

Afterward, the RF coil device measures forward current-voltage characteristics and reverse current-voltage characteristics of the PIN diode D1, as an index signal, and inputs the measurement results to the determination function 250 of the processing circuitry 280. The determination function 250 determines the presence/absence of a failure of the PIN diode D1 for each coil element in the above-mentioned manner.

After this, the processing proceeds to the Step S3.

[Step S3] As the above-mentioned third inspection processing, the frequency characteristic measuring circuit 266 transmits an RF pulse electric current while changing its frequency to a coil element of the RF coil device by wire. Thereby, the frequency characteristic measuring circuit 266 measures voltage level of the reflected signal inputted to the frequency characteristic measuring circuit 266 via the directional coupler by wire (see FIG. 6).

The frequency characteristic measuring circuit 266 inputs the measurement results of the frequency characteristics of voltage level of the reflected signal, as an index signal, to the determination function 250 of the processing circuitry 280. Then, the determination function 250 determines whether a failure exists or not, for each coil element based on the inputted frequency characteristics.

After this, the processing proceeds to the Step S4.

[Step S4] If any abnormality has not been found in all of the first to third inspection processings in the Step S1 to the Step S3, the determination function 250 advances the processing to the Step S5. Otherwise, the determination function 250 advances the processing to the Step S6.

[Step S5] As explained with FIG. 10, the information that the RF coil device is normal according to the inspection results is displayed on the monitor 240.

[Step S6] As explained with FIG. 11, the information on failure spot etc. obtained from the inspection results is displayed on the monitor 240. At the same time, the information used for repair such as the identification number of the RF coil device, the failure spot, the inspection results of the spot determined as abnormal, etc. are transmitted from the communication interface 252 to the service center 900, the personal information management terminal 800, and the MRI apparatus 10.

Although the foregoing is the explanation of the flow in FIG. 12, the order of the above first to third inspection processings is only an example. For instance, the third inspection processing may be performed before the second inspection processing.

Figure 13:
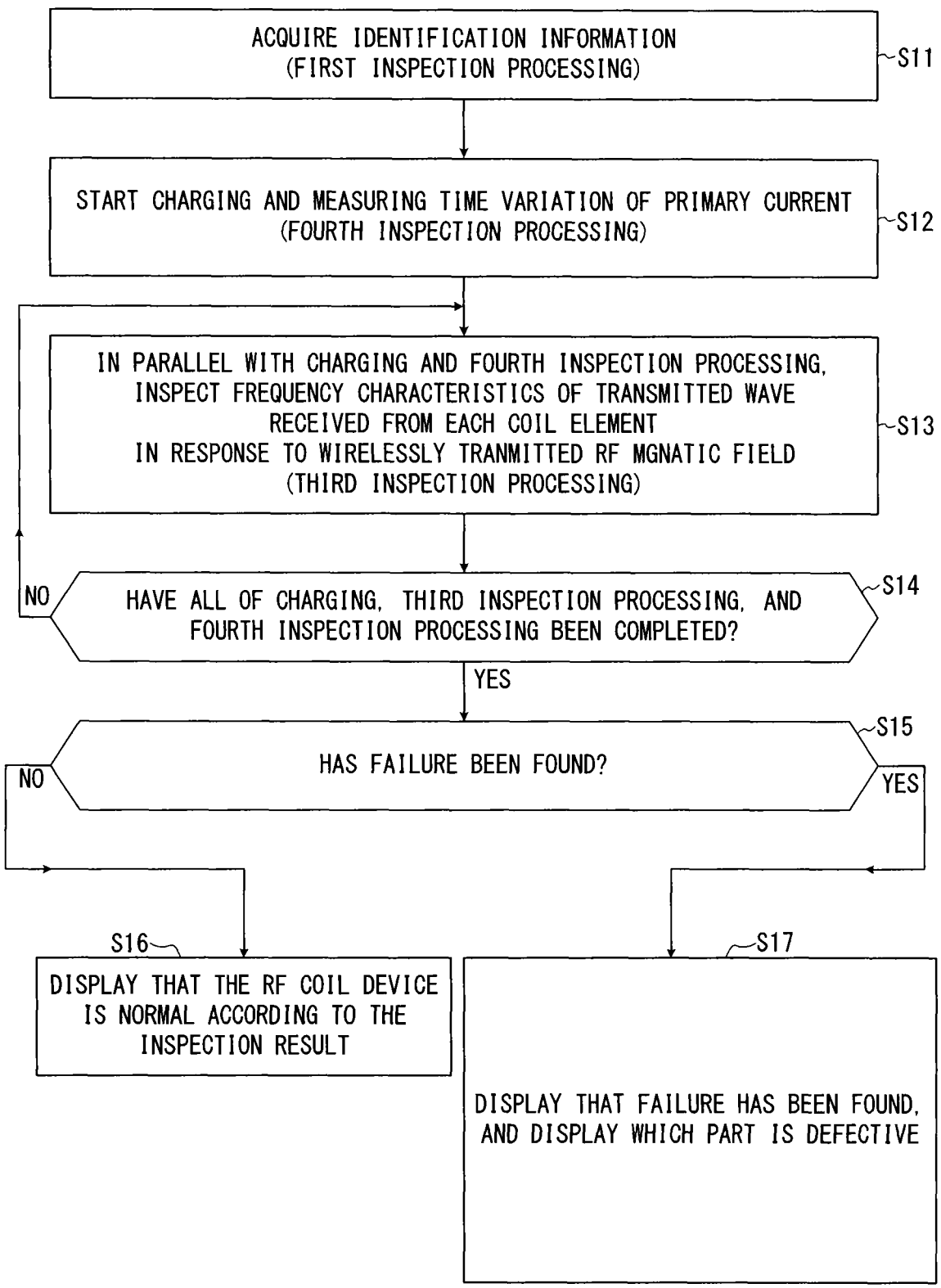
FIG. 13 is a flowchart showing an example of operation of the RF coil storage device, while storing an RF coil device configured to wirelessly transmit received MR signals to an MRI apparatus without being connected to a connection port.

FIG. 13 is a flowchart illustrating an example of operation of the RF coil storage device 200A, while storing an RF coil device configured to wirelessly transmit received MR signals to the MRI apparatus 10 without being connected to the connection port 264. In the following, according to the step numbers in the flowchart shown in FIG. 13, operation of the RF coil storage device 200A will be described by referring to the above-mentioned FIG. 1 to FIG. 12 as required.

[Step S11] As the above-mentioned first inspection processing, the control signal generator 260 (FIG. 2) controls the search coil ATa so as to wirelessly transmit a command signal to transmit the identification information. Afterward, an electromagnetic wave of the identification information wirelessly transmitted from the target RF coil device is detected by the search coil ATc and then decoded by the decode circuit 256, so as to extract the original identification information as an index signal.

Thereby, if the determination function 250 of the processing circuitry 280 has normally acquired the identification information, the determination function 250 determines that this RF coil device is normal as to the identification information and inputs the acquired identification information to the control function 248 of the processing circuitry 280. If the identification information has not been normally acquired, the determination function 250 determines that this RF coil device is abnormal as to the identification information.

After this, the processing proceeds to the Step S12.

[Step S12] The charger 262 starts wireless charge of the rechargeable battery BA inside the RF coil device and measurement of time variation of a primary current as an index signal in the above-mentioned fourth inspection processing.

After this, the processing proceeds to the Step S13.

[Step S13] In parallel with the above charging and the fourth inspection processing, the above-mentioned third inspection processing is performed. In other words, the search coil ATb radiates an RF magnetic field while changing its frequency under the control of the RF magnetic field generator 258, and the decode circuit 256 measures intensity of the electromagnetic field transmitted from a coil element. The determination function 250 of the processing circuitry 280 determines whether a failure exists or not, for each coil element based on the frequency characteristics of the electromagnetic wave (FIG. 5) inputted from the decode circuit 256 as an index signal resulted from the measurement.

After this, the processing proceeds to the Step S14.

[Step S14] If all of the charging, the third inspection processing, and the fourth inspection processing have been completed, the processing proceeds to the Step S15. If this is not the case, the processing of the Step S13 (the charging, the third inspection processing, or the fourth inspection processing) is continued.

[Step S15 to Step S17] The processings of the Step S15 to Step S17 are respectively the same as the processings of the Step S4 to the Step S6 in FIG. 12. Although the foregoing is the explanation of the flow in FIG. 13, the above order of the first, third, and fourth inspection processings is only an example. For instance, the fourth inspection processing may be stared after completing the charging and the third inspection processing.

The foregoing is a description of configuration and operation of the first embodiment.

As described above, according to the first embodiment, a failure of an RF coil device in MRI can be found in an early stage by the above-mentioned novel technology.

Specifically, presence/absence of a failure of an RF coil device is determined in terms of various angles such as (a) acquisition of the identification information, (b) operation of the PIN diode D1 of the active trap circuit 170 provided for each coil element, (c) frequency characteristics of a signal transmitted from each coil element after radiating an RF magnetic field to a space, (d) capacity of a rechargeable battery, and so on.

Even if MRI is normally performed, a failure sometimes occurs due to impact of detaching an RF coil device from an object immediately after completion of MRI.

If an abnormality occurs in any one part of the RF coil device even in such a case, an abnormal spot is automatically specified from the above-mentioned inspection processings in terms of various points during storage and it is automatically informed to the service center 900 or the like (see the Step S6 in FIG. 12 and the Step S17 in FIG. 13).

As the result of finding a failure in an early stage in this manner, performance of unsuccessful MRI with the use of a defective RF coil device is prevented. In addition, operational burden on a user as to the inspection processings is little or nothing, by setting the RF coil storage device 200A so as to perform the above inspection processings when the MRI apparatus 10 is not in operation such as night time, for example.

The Second Embodiment

Figure 14:
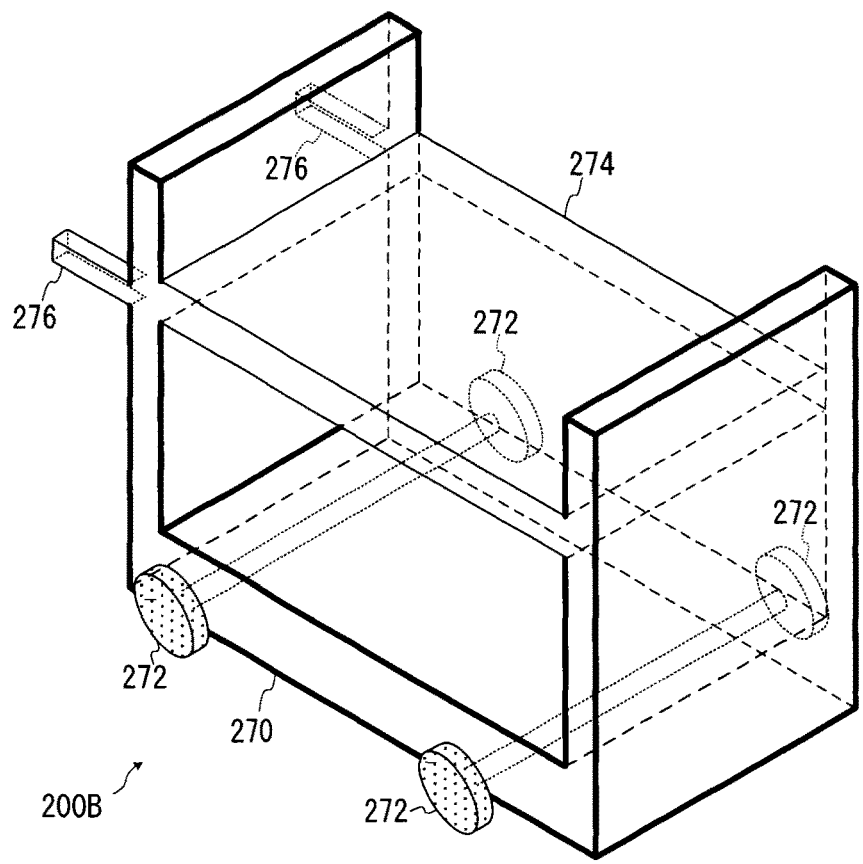
FIG. 14 is a schematic oblique drawing showing an example of profile of the RF coil storage device of the second embodiment.

FIG. 14 is a schematic oblique drawing showing an example of profile of the RF coil storage device 200B of the second embodiment.

Figure 15:
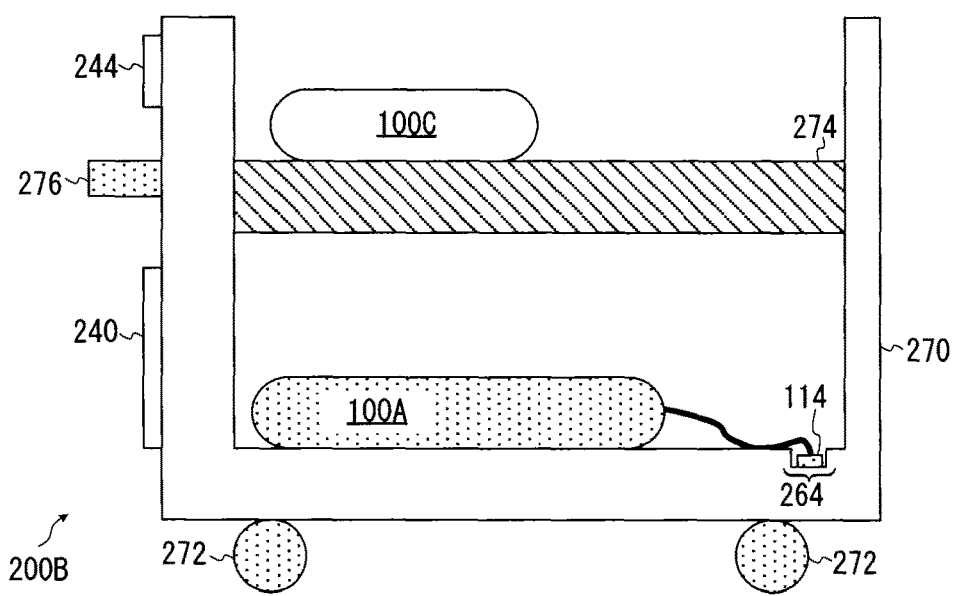
FIG. 15 is a schematic lateral view of the RF coil storage device shown in FIG. 14.

FIG. 15 is a schematic lateral view of the RF coil storage device 200B shown in FIG. 14.

Because the RF coil storage device 200B of the second embodiment is the same as the RF coil storage device 200A of the first embodiment except that it is configured as a storage hand-cart (i.e. movable storage rack) carrying RF coil devices, only the difference between them will be explained.

The RF coil storage device 200B includes a supporting base 270 indicated by the bold contour line in FIG. 14, four casters 272 rotatably fixed to the bottom surface of the supporting base 270, a shelf 274 indicated with a hatched region in FIG. 15, and two handles 276.

As shown in FIG. 15, the connection port 264 is disposed on the surface of the supporting base 270 which faces the shelf 274, and RF coil devices are placed (stored) on the supporting base 270. In the example of FIG. 15, the connector 114 of the upper-body RF coil device 100A is connected to the connection port 264.

In addition, another RF coil device can be placed (stored) also on the shelf 274. In the example of FIG. 15, the pelvic part RF coil device 100C is placed.

Moreover, on the back surface of the supporting base 270 (the surface where the handles 276 protrude), the operation device 244 is provided on the upper side in the vertical direction and the monitor 240 is provided on the lower side in the vertical direction as shown in FIG. 15.

The functional block diagram of the RF coil storage device 200B is the same as the functional block diagram of the first embodiment explained with FIG. 2, and the operation of the RF coil storage device 200B is the same as the first embodiment. The respective components of the RF coil storage device 200B are disposed in/on the supporting base 270 and the shelf 274. It is preferable that the charger 262, the connection ports 264, and the search coils ATa, ATb, and ATc are disposed on the shelf 274 and/or the placement surface of the supporting base 270 for placing RF coil devices, for example. This is so that the charger 262, the connection ports 264, and the search coils ATa, ATb, and ATc are located to positions as close to stored RF coil devices as possible.

As mentioned above, the same effects as the first embodiment can be obtained in the RF coil storage device of 200A of the second embodiment.

Supplementary Notes on Embodiments

[1] In each of the above embodiments, an example in which the search coil ATa configured to wirelessly transmit the control signal (command signal) from the control signal generator 260 and the search coil ATb configured to wirelessly transmit RF magnetic fields from the RF magnetic field generator 258 are separately disposed has been explained. However, embodiments of the present disclosure are not limited to such an aspect. One of the search coils ATa and ATb may be used for both of the above-mentioned functions so as to omit the other of them.

[2] In the first embodiment, an example of disposing only three search coils ATa, ATb, and ATc in the RF coil storage device 200A has been described for simplifying the explanation. However, the degree of freedom in arrangement of RF coil devices may be improved, by disposing plural search coils ATa, plural search coils ATb, and plural search coils ATc. For example, three search coils ATa, ATb, and ATc may be disposed on each of the shelves 220, 222, and 224.

[3] As to wireless type RF coil devices, for example, accuracy in inspection of wirelessly transmitted waves may be improved by providing display for limiting storage location (placing space) on each of the shelves 220, 222, and 224 in the first embodiment.

[4] In each of the above embodiments, an example in which the charger 262 charges the rechargeable battery BA in the RF coil device with an alternating current has been explained. However, embodiments of the present disclosure are not limited to such an aspect. For example, in the case of a rechargeable battery which does not include the rectifier REC and is charged with a direct current, the charger 262 may be configured to charge a rechargeable battery with a direct current. Also in this case, time variation of amplitude of the primary current or time variation of charging voltage is treated as an index signal in the way similar to above.

[5] The term "processor" used in the above explanation regarding the processing circuitry 280 etc. means, for instance, a circuit such as a CPU (Central Processing Unit), a GPU (Graphics Processing Unit), an ASIC (Application Specific Integrated Circuit), a programmable logic device including an SPLD (Simple Programmable Logic Device) and a CPLD (Complex Programmable Logic Device) as examples, an FPGA (Field Programmable Gate Array), and so on.

The number of processors provided in the processing circuitry 78 shown in FIG. 1 and the number of processors provided in the processing circuitry 280 shown in FIG. 2 may be respectively one, two, or more than two.

Each processor included in the processing circuitry 78 and 280 achieves its function by reading out a program directly stored in its own circuit and executing the program. Alternatively or additionally, the programs may be stored in non-illustrated memories respectively provided in the processing circuitry 78 and 280, instead of storing those programs in the processors.

When a plurality of processors are included in the processing circuitry 78 or 280, a memory for storing the programs may be provided for each processor. Alternatively or additionally, a single memory may collectively store the programs corresponding to the functions of all the processors, when plural processors are included in the processing circuitry 78 or 280.

[6] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An RF coil storage device configured to store an RF coil device, the RF coil device having a coil element and being configured to receive a magnetic resonance signal emitted from an object in response to an RF pulse transmitted from an RF transmitter included in an MRI apparatus, the RF coil storage device comprising:
   a storage rack on which the RF coil device is placed;
   a magnetic field generator including a search coil, wherein the magnetic field generator is provided separately from the RF transmitter, a static magnetic generator, and a gradient magnetic generator of the MRI apparatus, and wherein the magnetic field generator radiates an RF magnetic field from the search coil to the coil element of the RF coil device, via a space without using a cable, to inspect frequency characteristics of each coil element of the RF coil device; and
   processing circuitry configured to acquire an index signal to determine presence/absence of a failure, from the RF coil device placed on the storage rack,
   wherein the processing circuitry is further configured to acquire a transmitted wave transmitted from the coil element inside the RF coil device as the index signal, after radiation of the RF magnetic field, and determine whether the failure exists in the RF coil device or not, based on the transmitted wave acquired as the index signal.

2. The RF coil storage device according to claim 1, further comprising a communication interface,
   wherein the processing circuitry is further configured to determine whether the failure exists in the RF coil device or not, based on the index signal; and
   the communication interface is configured to transmit data as to presence/absence of the failure in the RF coil device based on the index signal, to at least one of a magnetic resonance imaging apparatus, a service center, and a personal information management terminal.

3. The RF coil storage device according to claim 1,
   wherein the magnetic field generator is further configured to radiate the RF magnetic field a plurality of times, while changing frequency of the RF magnetic field within a frequency band including a Larmor frequency for each radiation; and
   the processing circuitry is further configured to determine whether the failure exists in the RF coil device or not, based on frequency characteristics of the transmitted wave.

4. The RF coil storage device according to claim 1, further comprising a frequency characteristic measuring circuit configured to transmit an RF current to the coil element of the RF coil device by wire and acquire a reflected signal from the coil element by wire,
   wherein the processing circuitry is further configured to
   (a) acquire data of the reflected signal from the frequency characteristic measuring circuit, as the index signal, and
   (b) determine whether the failure exists in the RF coil device or not, based on frequency characteristics of the reflected signal.

5. The RF coil storage device according to claim 1, wherein the magnetic field generator is further configured to radiate the RF magnetic field to the space a plurality of times while changing a frequency of the RF magnetic field within a frequency band including a Larmor frequency for each radiation in a first case and a second case, respectively,
the first case being a case where a trap circuit is in an operating state, wherein the trap circuit is provided inside the RF coil device to turn on/off a function of receiving the magnetic resonance signal of the coil element by switching between an operating state and an non-operating state,
the second case being a case where the trap circuit is in the non-operating state, and
wherein the processing circuitry is further configured to
(a) acquire frequency characteristics of an intensity of each transmitted wave as the index signal from the coil element after radiation of the RF magnetic field, in the first case and the second case, respectively, and
(b) determine whether a failure exists in the trap circuit or not, by comparing the frequency characteristics in the first case with the frequency characteristics in the second case.

6. The RF coil storage device according to claim 1, further comprising a control signal generator configured to transmit an inspection signal by wire to a trap circuit, which is included in the RF coil device and turns on/off a function of receiving the magnetic resonance signal of the coil element,
wherein the processing circuitry is further configured to
(a) acquire current-voltage characteristics of a diode in the trap circuit from the RF coil device, as the index signal, and
(b) determine whether the failure exists in the RF coil device or not, based on the current-voltage characteristics.

7. The RF coil storage device according to claim 1, wherein the processing circuitry is further configured to
(a) acquire identification information of the RF coil device by wire from the RF coil device, as the index signal, and
(b) determine whether the failure exists in the RF coil device or not, based on the identification information.

8. The RF coil storage device according to claim 1, further comprising a control signal generator configured to wirelessly transmit a command signal to transmit identification information to the RF coil device,
wherein the processing circuitry is further configured to
(a) acquire the identification information wirelessly transmitted from the RF coil device after transmission of the command signal, as the index signal, and
(b) determine whether the failure exists in the RF coil device or not, based on the identification information.

9. The RF coil storage device according to claim 1, further comprising a charger configured to charge a rechargeable battery inside the RF coil device,
wherein the processing circuitry is further configured to
(a) acquire a time variation of a primary current or time variation of a charging voltage of the rechargeable battery as the index signal, when the charger charges the rechargeable battery, and
(b) determine whether the failure exists in the RF coil device or not, based on the index signal.

10. The RF coil storage device according to claim 1, further comprising a monitor,
wherein the processing circuitry is further configured to determine whether the failure exists in the RF coil device or not, based on the index signal; and
the monitor is configured to display a determination result as to presence/absence of the failure, as determined by the processing circuitry.

* * * * *